United States Patent [19]

Fowler

[11] 4,240,072
[45] Dec. 16, 1980

[54] LOAD INDICATOR FOR AN AIR CLEANER

[75] Inventor: Thomas P. Fowler, Madison, Wis.

[73] Assignee: Research Products Corporation, Madison, Wis.

[21] Appl. No.: 21,720

[22] Filed: Mar. 19, 1979

[51] Int. Cl.³ .......................................... G08B 21/00
[52] U.S. Cl. .................................... 340/664; 340/648; 361/31; 324/127
[58] Field of Search ............... 340/648, 661, 664, 607; 324/127; 361/31, 87, 93; 310/68 C

[56] References Cited

U.S. PATENT DOCUMENTS

| | | | |
|---|---|---|---|
| 3,482,236 | 12/1969 | Seney | 340/664 |
| 3,738,088 | 6/1973 | Colosimo | 55/104 |
| 3,809,985 | 5/1974 | Krause et al. | 340/648 |
| 3,851,216 | 11/1974 | Clarke et al. | 361/31 |
| 3,875,464 | 4/1975 | Gary et al. | 340/648 |
| 3,962,694 | 6/1976 | Calia et al. | 340/664 |
| 3,996,513 | 12/1976 | Butler | 324/127 |
| 4,007,401 | 2/1977 | Kimmel et al. | 340/664 |
| 4,040,052 | 8/1977 | Mayer | 340/648 |
| 4,100,488 | 7/1978 | Quietzsch et al. | 324/127 |
| 4,156,262 | 5/1969 | Eller et al. | 361/31 |
| 4,160,282 | 7/1979 | Dolinan et al. | 361/31 |

Primary Examiner—Gerald L. Brigance
Attorney, Agent, or Firm—Andrus, Sceales, Starke & Sawall

[57] ABSTRACT

A load indicator for an air cleaner associated with an air movement system which conducts air to a designated area in response to the supply of electrical energy from an energy source. An energy sensor includes a closed loop flux conducting circuit which is removably connected to surround at least one lead of the energy supplying circuit for generating a magnetic flux signal substantially proportional to the energy flow in the lead. The indicator operatively responds to a flux signal of a predetermined magnitude for providing a predetermined load indicating signal for the filter.

6 Claims, 4 Drawing Figures

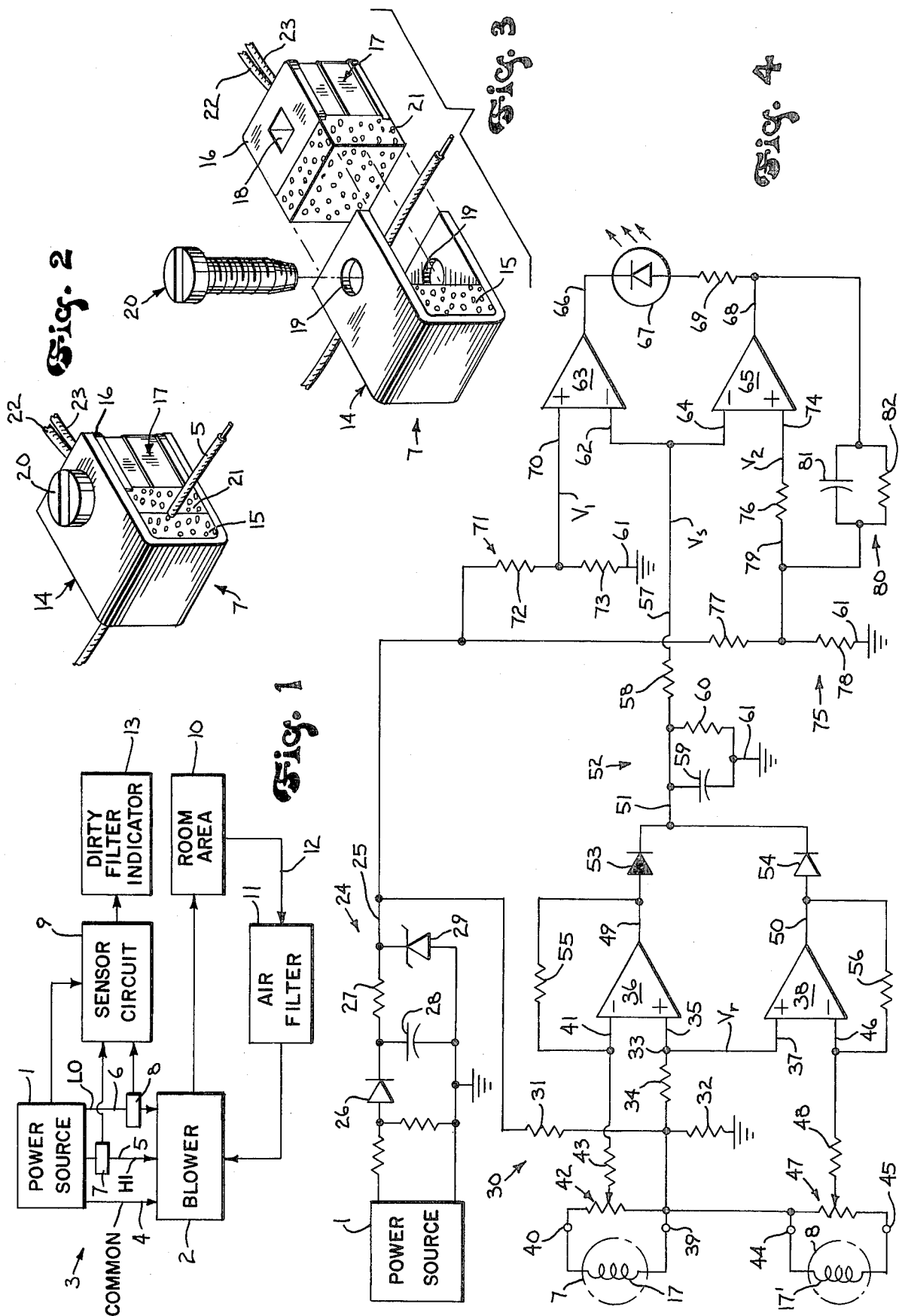

LOAD INDICATOR FOR AN AIR CLEANER

BACKGROUND OF THE INVENTION

This invention relates to a load indicator for an air cleaner associated with an air movement system operating in response to electrical energy supplied through a conducting circuit.

Normal blower operations such as in a furnace or air conditioning system designed for home use or the like generally operates in response to energizing current of a predetermined magnitude. When such fan is employed in conjunction with a clean air filter, the fan operates properly and the energizing current remains substantially constant. As the filter begins to collect dirt and lint, the blower moves less air, thereby causing a decrease in the load on the blower motor which has been found to decrease the magnitude of the energizing current. If the filter is not cleaned or replaced, it may become sufficiently clogged so as to substantially reduce the passage of air and thereby affecting the ability of the system to heat or cool the home or commercial establishment. In such situations, a sharp increase in energizing current well above the normal operating current level occurs which may tend to burn out the blower motor and cause severe damage.

One disclosed prior system senses, through the insertion of a current sensing resistor within the blower energizing circuit, an excessive current level flowing to the blower motor which generally occurs after the filter is severely contaminated which might otherwise burn out the fan motor through excessively high currents, such as suggested in U.S. Pat. No. 4,040,042 issued to Horst Mayer on Aug. 2, 1977.

SUMMARY OF THE INVENTION

This invention relates to a load indicator for an air cleaner associated with an air movement system operating in response to energy supplied through a conducting circuit.

The load indicator provides a closed loop flux conducting circuit which is removably connected to surround at least one lead of the conducting circuit for generating a magnetic flux signal substantially proportional to the energy flow through the lead. An indicator operatively responds to the flux signal of a predetermined magnitude to provide a load indicating output signal for a particular load in the air cleaner.

The flux conducting circuit generates a first magnitude flux signal in response to the absence of energy flow in the conducting lead while generating a second magnitude flux signal which is greater than the first magnitude in response to the sensed energy flow in the conducting lead during a normal operation of the air cleaner. The flux conducting circuit further generates a third magnitude flux signal greater than the first magnitude and less than the second magnitude in response to energy flow in the conducting lead during a particular load of the air cleaner. The indicator thus provides a first signal in response to the second magnitude flux signal indicating a normal operation and a second signal indicating a predetermined load in response to the third magnitude flux signal.

The closed loop flux conducting circuit provides a portion which is selectively movable to a first position establishing the closed loop flux conducting circuit and a second position establishing an open loop permitting the sensor to be removably connected to surround the conducting circuit lead. The system thus can be easily and economically connected to an existing air circulating system without disrupting or disfiguring the connecting circuit to provide a convenient air filter sensing operation. The system further can be connected to a plurality of selectively energized leads for flexible operation.

BRIEF DESCRIPTION OF THE DRAWING

The drawing furnished herewith illustrates a preferred construction of the present invention in which the above advantages and features are clearly disclosed, as well as others which will be clear from the following description.

In the drawings:

FIG. 1 is a diagrammatical block illustration of an air circulating system for heating or cooling a room or other area and incorporating an air filtering apparatus and a control for sensing and indicating a malfunction of such filtering apparatus.

FIG. 2 is a perspective view of an electro-magnetic sensor employed in FIG. 1;

FIG. 3 is an exploded view of an electromagnetic sensor of FIG. 2; and

FIG. 4 is an electrical circuit schematic illustrating the sensor control and indicator of FIG. 1.

DESCRIPTION OF THE PREFERRED ILLUSTRATED EMBODIMENT

Referring to the drawing and particularly to FIG. 1, a power source 1 is selectively controlled to supply electrical energy to a fan or blower 2 associated with a furnace or air conditioning unit. A connecting circuit 3 conducts the energy between power source 1 and blower 2 and includes a common lead 4, a high speed lead 5 generally employed in an air conditioning sequence, and a low speed lead 6 generally employed in a heating operation. An energy monitor or sensor 7 is located adjacent lead 5 while an energy monitor or sensor 8 is located adjacent lead 6, with both sensors 7 and 8 connected for supplying an input to a sensor control 9.

The blower 2 is connected in a conventional manner to supply or circulate heated or cooled air to an area 10, such as a room, building or the like. Generally, the warm or cool air is conducted from the room area 10 through an air return 12 and an air filter 11 to the blower 2 for recirculation in a closed loop system. The air filter 11 may be positioned as shown in the air return 12 or alternatively could be placed between blower 2 and area 10.

In operation, either the sensor 7 or the sensor 8 respond to the energy flow between power source 1 and blower 2 for determining when a predetermined load exists with respect to the air filter 11. When the air filter 11 becomes clogged with dirt or debris, a dirty filter indicator 13 is activated by sensor control 9 in response to a predetermined sensed energy flow between power source 1 and blower 2.

The sensors 7 and 8 are illustrated in FIGS. 2 and 3. A U-shaped metal bracket 14 retains an insulating member 15 made of plastic foam or the like. A bobbin 16 is removably retained between a pair of spaced legs of bracket 14 and includes a coil 17 which surrounds an opening 18. When connected, the opening 18 of bobbin 16 communicates with a pair of spaced openings 19 located within the pair of spaced legs of bracket 14. A magnetic flux conducting screw or bolt 20 is removably located within openings 18 and 19 for securing the bobbin 16 to the U-shaped bracket 14. In addition, the screw or bolt 20 forms a magnetic flux conducting closed loop circuit with the U-shaped bracket 14. An insulating member 21 of plastic foam or the like is secured along a portion of bobbin 16 and removably engages the opposing insulating member 15. When assembled, an electrical lead being monitored, such as lead 5 for example, is sandwiched between the insulating members 15 and 21. Current flow through lead 5 induces magnetic flux through the U-shaped bracket and connecting screw 20. The coil 17, which is spaced from screw 20 by the insulating core of bobbin 16, generates an output signal through a pair of leads 22 and 23 in response to the magnetic flux developed by the current flowing through lead 5. When monitoring an A.C. current flow through lead 5, the sensor coil 17 will provide an A.C. signal at output leads 22 and 23 which is directly proportional to the current flowing through lead 5.

The sensors 7 or 8 are more fully described in the copending application of Thomas P. Fowler entitled, Energy Sensor, filed on an even date herewith, and is incorporated by reference herein. The sensors are also shown in the copending application of Thomas P. Fowler entitled, Humidifier Control, filed on an even date herewith, and is incorporated by reference herein.

The sensor control 9 is illustrated in FIG. 4 and includes a D.C. bias voltage circuit 24 which is constructed of conventional components in a well-known manner to provide a substantially constant D.C. reference voltage at a lead 25, such as ten volts D.C. for example. In such circuit, a diode 26 provides rectification of the incoming A.C. voltage while resistor 27 and capacitor 28 provide filtering. The Zener diode 29 provides a clamp to regulate the D.C. voltage appearing at the D.C. bias voltage lead 25.

A voltage divider 30 includes serially connected resistors 31 and 32 which establish a reference voltage $V_r$ at lead 33 as supplied through a connecting resistor 34. The D.C. bias voltage at lead 33 is also supplied to a non-inverting input 35 of an operational amplifier 36 and a non-inverting input 37 of an operational amplifier 38.

The coil 17 of sensor 7 is connected to an input terminal 39 which, in turn, is connected to the voltage divider 30. The coil 17 is also connected to an input terminal 40 which, in turn, is connected to an inverting input 41 of the amplifier 36 through a variably tapped potentiometer 42 and a connecting resistor 43. In like manner, the coil 17' of sensor 8 is connected to an input terminal 44 which, in turn, is connected to the voltage divider 30. The coil 17' is also connected to input terminal 45 which, in turn, is connected to an inverting input 46 of amplifier 38 through a variably tapped potentiometer 47 and a connecting resistor 48.

The operational amplifiers 36 and 38 are similarly constructed and provide output circuits 49 and 50, respectively. The output circuit 49 is connected to an input circuit 51 of an integrating circuit 52 through a steering diode 53 while the output 50 is connected to input circuit 51 through a steering diode 54. The output 49 of amplifier 36 is also connected to the inverting input 41 through a feedback resistor 55 while the output 50 of operational amplifier 38 is connected to inverting input 46 through a feedback resistor 56.

The integrating circuit 52 responds to a signal at input 51 to provide an integrated output signal $V_s$ at output lead 57. The integrating circuit 52 includes a resistor 58 which connects the input circuit 51 to the output circuit 57 while an integrating capacitor 59 and a resistor 60 are connected in parallel and join the input circuit 51 to the system ground or neutral 61.

The output 57 of integrator 52 is connected to an inverting input 62 of an operational amplifier 63 and to an inverting input 64 of an operational amplifier 65. An output circuit 66 of amplifier 63 is connected to a cathode circuit of a light emitting diode 67. An output circuit 68 of amplifier 65 is connected to an anode circuit of the light emitting diode 67 through a connecting resistor 69.

A non-inverting input 70 of amplifier 63 provides a reference voltage $V_1$ as supplied through a voltage divider 71. Specifically, the D.C. voltage source lead 25 is coupled to the system neutral or ground 61 through a pair of serially connected resistors 72 and 73 with the juncture therebetween connected to input 70.

A non-inverting input 74 of amplifier 65 is connected to a voltage divider circuit 75 through a connecting resistor 76. In such voltage divider arrangement, the D.C. voltage source lead 25 is connected to the system ground or neutral 61 through a pair of serially connected resistor 77 and 78, the juncture of which is connected to an output circuit 79 for providing a D.C. reference voltage $V_2$ to the non-inverting input 74 of operational amplifier 65. A feedback circuit 80 provides a parallel connected capacitor 81 and resistor 82 for coupling the output 68 to the non-inverting input 74 of amplifier 65 for stable operation.

The operational amplifiers 36, 38, 63 and 65 may be selected from any commercially available components and may be formed in a single integrated circuit such as commercially available from Fairchild under the designation uA4136PC.

When blower 2 is in a de-energized condition, all energy or current between power source 1 and blower 2 will cease. Under such condition, the sensors 7 and 8 will provide quiescent output signals indicating a lack of energy flow. In that sensors 7 and 8 and amplifiers 36 and 38 are identically constructed and operate in an identical manner, only sensor 8 and amplifier 38 will be described in detail and it is understood that sensor 7 and amplifier 36 will operate in a similar manner. With the output of sensor 8 indicating a quiescent, non-conductive condition within lead 6, the amplifier 38 is maintained in a "turned-off" condition and the signal $V_s$ at output 57 is maintained at a logic "0" or system ground potential. The voltage divider 71 establishes a reference voltage $V_1$, such as three (3) volts D.C. for example, at the non-inverting input 70 of amplifier 63. The voltage divider 75 establishes a reference voltage $V_2$, such as seven (7) volts D.C. for example, at the non-inverting input 74 of amplifier 65.

When the blower 2 is de-activated, the current or energy flow through the connecting circuit 3 will cease and the outputs of sensors 7 and 8 will indicate a quiescent, de-energized condition. The amplifiers 36 and 38 will remain in a "turned-off" state so that the output at leads 49, 50, 51 and 57 will be maintained at the system ground or neutral level. With the signal $V_s$ at the system neutral or ground level, amplifiers 63 and 65 are in a "turned-on" state and the output circuits 66 and 68 are maintained at a logic "1", such as ten (10) volts D.C. for example. The logic "1" signal at output 66, however, reverse-biases the photo-diode 67 which remains de-energized.

When power source 1 is activated to supply A.C. energy to blower 2 through lead 6, the sensor 8 responds to provide a proportional A.C. output signal through potentiometer 47 to the inverting input 46 of amplifier 38. In normal operation, the blower 2 is operated at one or more predetermined speeds, all of which require energizing current above a predetermined magnitude (Imin) for a desirable operation.

Assuming that lead 6 is energized, sensor 8 will provide an A.C. signal to the control circuit 9 which is proportional to the A.C. current flowing through lead 6. The amplifier 38 is rendered conductive during alternate half-cycles and supplies an amplified square wave signal at output 50 which has a peak magnitude proportional to the peak magnitude of the current flowing through lead 6. The capacitor 59 rapidly charges to the peak magnitude of the square wave signal provided by output 50. The signal $V_s$ at output 57 thus constitutes a D.C. voltage which is directly proportional to peak magnitude of the A.C. current flowing through lead 6 and thus proportional to the energy flow therein.

When the current flow through lead 6 exceeds the predetermined magnitude, i.e. greater than I min, the signal $V_s$ exceeds the reference signals $V_1$ and $V_2$ and both of the amplifiers 63 and 65 "turn-off" and supply a logic "0" output, which constitutes the system neutral or ground potential, at the outputs 66 and 68. The photo-diode 67 thus remains non-conductive and indicates that the filter 11 is operating properly.

When the air filter reaches a predetermined load such as due to clogging by dirt or debris, the energy or current level flowing through lead 6 will decrease and the proportional A.C. signal provided by sensor 8 likewise decreases. The integrator output $V_s$ decreases to a magnitude less than the reference signal $V_2$ but larger than the reference signal $V_1$. In such circumstances, the amplifier 63 remains "turned-off" and the output 66 remains at the logic "0" or system neutral or ground potential. The amplifier 65, however, "turns-on" and provides a logic "1" signal at output 68, such as ten (10) volts D.C. for example. A conducting circuit is established through the light emitting diode 67 which signals that a dirty filter condition exists.

The preceding description of an operating sequence for low speed operation under the energization of lead 6 would also be applicable for high speed operation where sensor 7 senses the energy flow through lead 5. In the latter case, amplifier 36 would function in the manner above described for amplifier 38. The adjustable taps of potentiometers 42 and 47 can be selectively adjusted to calibrate a suitable magnitude voltage level for the integrator output signal $V_s$ for the current levels being sensed in leads 5 and 6.

The air filter monitor provides continuous sensing of an energized circuit which operates an air conducting fan associated with an air filter for determining whether a malfunction exists within the filtering operation. The system continuously responds to either the de-energization of the air circulating fan or to its normal energization for providing an output indicating a proper and desirable operation. The system further operates to provide a second output indicative of a predetermined load in such filter.

Various modes of carrying out the invention are contemplates as being within the scope of the following claims particularly pointing out and distinctly claiming the subject matter which is regarded as the invention.

I claim:

1. A load indicator to provide an early warning of a contaminated air cleaner within an air movement system by monitoring the electrical energy supplied through an energy conducting circuit lead to an air movement fan within the air movement system used for conducting air to a designated area, said load indicator comprising energy sensor means including a closed loop flux conducting circuit removably connected to surround said conducting circuit lead to generate a magnetic flux signal output substantially proportional to the energy flow through said lead, and indicating means having an input connected to operatively respond to said flux signal output to provide an early warning signal indicating a contaminated air cleaner by sensing a decrease in the magnitude of electrical energy flowing through the circuit lead.

2. The load indicator of claim 1, wherein said flux conducting circuit generates a first magnitude flux signal in response to the absence of energy flow in said lead and a second magnitude flux signal greater than said first magnitude in response to energy flow in said lead during a normal operation of said air cleaner and a third magnitude flux signal greater than said first magnitude and less than said second magnitude in response to energy flow in said lead during a predetermined load in said air cleaner, said indicating means providing a first signal in response to said second magnitude flux signal indicating a normal operation and a second signal providing an early warning of a contaminated air cleaner in response to said third magnitude flux signal.

3. The load indicator of claim 1, wherein said closed loop flux conducting circuit includes a portion selectively movable between a first position establishing said closed loop flux conducting circuit and a second position establishing an open loop for permitting said sensor means to be removably connected to surround said conducting circuit lead.

4. A load indicator to provide an early warning of a contaminated air cleaner within an air movement system by monitoring the electrical energy supplied through an energy conducting circuit to an air movement fan within the air movement system used for conducting air to a designated area, said load indicator comprising energy sensor means connected to monitor said conducting circuit and having output means generating a first magnitude output in response to the absence of energy flow in said lead and a second magnitude output greater than said first magnitude in response to energy flow in said lead during a normal operation of said air cleaner and a third magnitude output greater than said first magnitude and less than said second magnitude in response to energy flow in said lead during the early stage of contamination of said air cleaner, and indicating means having an input connected to operatively respond to said sensor output means and providing a first signal in response to said second magnitude output for indicating a normal operation and a second signal in response to said third magnitude output for indicating the early stage of contamination of said air cleaner.

5. A load indicator for an air movement system operatively receiving electrical energy through an energy conducting circuit for conducting air to a designated area and an air cleaner connected to said air movement system for cleaning the air, said load indicator comprising an energy sensor including a closed loop flux conducting circuit removably surrounding at least one lead of said circuit and generating a first magnetic flux signal having a first predetermined magnitude in response to the absence of energy flow in said lead and a second magnetic flux signal having a second predetermined magnitude greater than said first magnitude in response to energy flow in said lead during a normal operation of said air cleaner and a third magnetic flux signal having a third predetermined magnitude greater than said first magnitude and less than said second magnitude in response to energy flow in said lead during a predetermined loading of said air cleaner and a coil surrounding a portion of said flux conducting circuit and generating an A.C. electrical signal proportional to said flux signals, an amplifier having an input connected to receive said A.C. electrical signal from said coil and an output providing an amplified pulse output during alternate half cycles having a magnitude substantially proportional to said A.C. electrical signal, means integrating said amplified pulse output and providing a D.C. signal substantially proportional to said flux signals, a first switching comparator having an input connected to receive said D.C. signal and providing a first output when said D.C. signal is below a first predetermined reference magnitude and a second output when said D.C. signal exceeds said first predetermined reference magnitude, a second switching comparator having an input connected to receive said D.C. signal and providing a first output when said D.C. signal is below a second predetermined reference magnitude different than said first magnitude and a second output when said D.C. signal exceeds said second predetermined reference magnitude, and indicator means connected to said first and second switching comparators and providing a first signalling output in response to said first and second flux signals for indicating a normal air cleaner operation and a second signalling output in response to said third flux signal for indicating a predetermined loading in said air cleaner.

6. The load indicator of claim 5, and including a second energy sensor constructed identically to said first sensor and monitoring a second lead within said conducting circuit, a second amplifier connected to receive a second A.C. electrical signal from said second coil and a second output providing a second amplified pulse output during alternate half cycles having a magnitude substantially proportional to said second A.C. electrical signal, said integrating means integrating said second amplified pulse output and providing said D.C. signal substantially proportional to the flux signals in said second energy sensor.

* * * * *